United States Patent [19]

Pearlman

[11] 4,234,669
[45] Nov. 18, 1980

[54] CRT SCREEN STRUCTURE PRODUCED BY PHOTOGRAPHIC METHOD

[75] Inventor: Samuel Pearlman, Lancaster, Pa.

[73] Assignee: RCA Corporation, New York, N.Y.

[21] Appl. No.: 24,391

[22] Filed: Mar. 27, 1979

Related U.S. Application Data

[63] Continuation-in-part of Ser. No. 800,285, May 25, 1977, abandoned.

[51] Int. Cl.³ ................................................ G03C 5/00
[52] U.S. Cl. ........................................ 430/25; 427/68; 430/29; 430/325
[58] Field of Search ............... 96/36.1, 95, 115 R, 96/115 P, 35.1, 36; 427/64, 68; 430/25, 29, 294, 306, 325

[56] References Cited

U.S. PATENT DOCUMENTS

| 3,558,310 | 1/1971  | Mayaud   | 96/36.1 |
| 3,623,867 | 11/1971 | Saulnier | 96/36.1 |
| 3,689,266 | 9/1972  | Kawamura | 96/36.1 |
| 3,788,846 | 1/1974  | Mayaud   | 96/36.1 |
| 3,981,729 | 9/1976  | Saulnier | 96/36.1 |
| 4,049,452 | 9/1977  | Nekut    | 96/36.1 |

FOREIGN PATENT DOCUMENTS 7523326 of 1975 Japan .

OTHER PUBLICATIONS

*Photoresists,* DeForest, 1975, pp. 189–194.

*Primary Examiner*—Edward C. Kimlin
*Attorney, Agent, or Firm*—E. M. Whitacre; G. H. Bruestle; L. Greenspan

[57] ABSTRACT

A method for preparing a screen structure for a cathode-ray tube comprising
(a) exposing a water-soluble photopolymeric film on a surface to a light image to insolubilize selected portions of the film,
(b) flushing the exposed film with an aqueous medium that is free from borate ions to remove only the still-soluble portions of the film, thereby producing a stencil on the surface,
(c) rinsing the stencil with an aqueous solution containing borate ions to prevent further removal of material from said stencil,
(d) then overcoating the stencil and the surface not covered by the stencil with pigment particles,
(e) and then removing only the stencil and the overcoating thereon.

10 Claims, No Drawings

CRT SCREEN STRUCTURE PRODUCED BY PHOTOGRAPHIC METHOD

CROSS REFERENCE TO RELATED APPLICATION

This is a continuation in part of application Ser. No. 800,285 filed May 25, 1977, now abandoned.

BACKGROUND OF THE INVENTION

This invention relates to a novel photographic method for preparing a screen structure for a cathode-ray tube (CRT) and particularly, but not exclusively, to a novel method for preparing a light-absorbing matrix for a color television picture tube.

Color television picture tubes which include a light-absorbing matrix as a structural part of the luminescent screen have been described previously; for example, in U.S. Pat. Nos. 2,842,697 to F. J. Bingley, and 3,146,368 to J. P. Fiore et al. These patents describe color television picture tubes of the aperture-mask type (also called shadowmask type) in which a light-absorbing matrix is located on the inner surface of the faceplate of the tube. In this structure, the matrix has openings therein which are filled with phosphor material.

A reverse-printing method for preparing a light-absorbing matrix for a CRT is described in U.S. Pat. No. 3,558,310 to E. E. Mayaud. In a preferred embodiment of that method, the inner surface of the faceplate of a CRT is coated with a film of water-based photopolymeric material, typically a dichromate-sensitized polyvinyl alcohol. A light image is projected on the film to insolubilize selected regions of the film. The film is developed by flushing the film with water to remove the still-soluble regions of the film while retaining the insolubilized regions in place. Then, the developed film or stencil and the bare areas of the surface are overcoated with a layer containing particles of light-absorbing material, such as graphite. Finally, the overcoating is developed by removing the stencil together with the overlying overcoating, while retaining the overcoating on the areas of the surface not covered by the stencil.

Such a process produces satisfactory light-absorbing matrices in automated and semiautomated factory production. However, frequently, the overall appearances of matrices are marred by streaks and swirls. Such streaks and swirls are believed to result from the leaching of soluble and/or partially-soluble material from the stencil, which leached material is then redistributed in a random manner by gravitational and centrifugal forces during and after development of the film. Careful examination has shown that these streaks and swirls are merely cosmetic, resulting from very slight nonuniformities in the sizes of the openings in the matrix. Although they may have a trivial effect on the performance of the tube, nevertheless streaks and swirls adversely affect the salability of picture tubes which have them.

Polyvinyl alcohol as used by the CRT maker is a product of polyvinyl-acetate manufacturing whose main uses are in the paint and adhesive industry. Attempts have been made to supply a special electronic-grade of polyvinyl alcohol, but the cost is prohibitive because the total amount used is small. Therefore, the CRT maker uses materials made for the textile, paper and binder industries. The chemical character of those polyvinyl alcohols is dictated by the uses in the aforementioned industries.

The principal factors governing the properties of polyvinyl alcohol are the degree of polymerization and the percent hydrolysis. While proper blending of batch-produced polyvinyl alcohol can provide products within a given saponification range, such materials will contain much larger amounts of high and low molecular weight fractions and of portions varying widely in degrees of hydrolysis. This type of manufacturing variation produces products with varying degrees of cold-water solubility. The CRT maker, to make matrix stencils, dissolves away that part of the polyvinyl alcohol not insolubilized by the actinic radiation, while retaining the insolubilized part as a stencil. All regions of the stencil have some partially-soluble material therein. This partial solubility of the polyvinyl alcohol varies with the lots supplied by the manufacturer.

Prior to coating the photopolymeric film on the faceplate surface, the dry, powdered polyvinyl alcohol is dissolved in water. This step also may introduce variations in the cold-water solubility of the stencil-making material.

SUMMARY OF THE INVENTION

The novel method is similar to the previous method disclosed in the above-cited Mayaud patent except that, after the exposed film is developed with water or other aqueous medium, which medium is free from borate ions, the retained and still-wet developed film or stencil is rinsed with an aqueous solution containing borate ions, whereby an encapsulating skin is formed on the stencil for preventing further removal of material from the stencil. Solutions of boric acid or borax are preferred, although solutions of a soluble borate, perborate, or other boron compound singly or in combination may be used.

Rinsing the developed film or stencil with an aqueous solution containing borate ions essentially eliminates the cosmetic defects described above. This rinsing step has the effect of preventing soluble and partially-soluble material in the stencil from being leached out by any subsequently-applied aqueous medium and the leached material being distributed in a random manner. Also, the variable cold-water solubility of the stencil material is suppressed by the novel method, resulting in a more uniform product.

DESCRIPTION OF THE PREFERRED EMBODIMENT

Example 1

A preferred embodiment for preparing a light-absorbing matrix on the inner surface of the faceplate of an aperture-mask-type color television picture tube will now be described. First, the inner surface of the faceplate is cleaned in the usual way as with water, ammonium bifluoride, hydrofluoric acid, detergent, caustic, etc. to remove any foreign matter. Then the surface is coated with a film of dichromate-sensitized polyvinyl alcohol. The film may be produced by depositing on the surface of the faceplate a quantity of an aqueous solution containing about:

|  | Weight Percent |
|---|---|
| Polyvinyl alcohol | 3.42 |
| Ammonium dichromate | 0.34 |

| | Weight Percent |
|---|---|
| Water | Balance to 100 |

The faceplate is rotated and tilted so that the quantity of solution spreads evenly over the surface. During the latter steps of rotation, infrared heat is applied so that the water in the solution evaporates and a dry photopolymeric film is formed on the surface.

An aperture mask for the faceplate is positioned above and spaced from the film and the assembly is placed in a lighthouse, which is a known apparatus for exposing the film on the faceplate by projecting light through the apertures in the mask. In this example, the mask has circular apertures with a diameter of about 13 mils and a center-to-center spacing between apertures of about 28 mils near the center of the mask. The film is exposed for about 8 minutes to light from a 1,000-watt quartz lamp positioned about 14 inches from the aperture mask. During the exposure, light from the lamp is passed through a light pipe or collimator and projected through the mask causing beamlets of light to pass through the apertures of the mask incident upon the film. The irradiated regions of the film harden; that is, become insoluble in water. There is a slight enlargement of the exposed areas above the size of its associated aperture (to about 16 mils) and a graded hardening at the margins of the exposed areas. The exposure through the mask is repeated three times, each time with the light incident at a slightly different angle so that the beamlets harden the film in groups of three, as in the usual aperture-mask screen manufacture.

Following exposure, the assembly is removed from the lighthouse and the mask is separated from the faceplate. The exposed coating is subjected to flushing with a forced spray of water, which may contain a detergent, for about 30 seconds, after which the faceplate is rinsed with water. The water in both of the foregoing steps is free from borate ions. Then, the still-wet faceplate and retained film regions are rinsed for about 30 seconds with a solution containing borate ions. Such borate solutions are described in more detail below. In this example, the faceplate is rinsed with a 0.5 weight-percent solution of boric acid. Then the retained film regions and faceplate are dried with or without the assistance of applied heat. At this point in the process, the faceplate surface carries an adherent stencil comprised of bare surface areas and of dots of hardened polymeric film coated on the surface.

The stencil and the bare surface areas are now overcoated with a composition comprised of light-absorbing particles. In this example, the overcoating is produced by applying to the said stencil a slurry containing about 5.0 weight percent of colloidal graphite in water and then drying the overcoating. It is desirable to include a trace of wetting agent in the graphite slurry in order to facilitate the spreading of the slurry over the stencil. The overcoating is dried thoroughly for about 1.5 minutes with the aid of infrared heat. After cooling, the overcoating is well adhered both to the stencil and to the bare faceplate surface areas not covered by the stencil.

Next, a chemically digestive agent for the polymeric dots is applied to develop the overcoating. In this example, the digestive agent is an aqueous solution containing about 4.0 weight-percent hydrogen peroxide. This solution may be applied to the overcoating as a wash or as a spray under pressure. The hydrogen peroxide solution penetrates the overcoating and the stencil, causing the light-hardened polyvinyl alcohol of the stencil to swell and soften. Subsequent flushing with water removes the softened stencil together with the overlying portions of the overcoating, but leaves behind that portion, or portions, of the overcoating which is adhered directly to the surface of the faceplate not covered by the stencil. At this point, the faceplate carries a black light-absorbing matrix having a multiplicity of circular holes therethrough about 16 mils in diameter. The edges of the pattern are relatively smooth.

The black, light-absorbing matrix is now rinsed with water and dried for about 4 minutes with the aid of infrared heat. Then, the faceplate is processed in the usual way to deposit red-emitting phosphor dots, green-emitting phosphor dots and blue-emitting phosphor dots about 17 mils in diameter in the holes of the matrix. The slight enlargement of the phsophor dots over the holes in the matrix is achieved by the spreading of light during projection, which may be enhanced by increasing the exposure time of the hardened areas. The luminescent screen may now be processed in the usual way to apply a reflective metal layer on top of the phosphor dots and the black matrix. The screen is baked and assembled with the aperture mask into a CRT in the usual way.

Example 2

Follow the procedure of Example 1 except employ a 0.05 weight-percent solution of boric acid and rinse the stencil for 12 seconds.

Example 3

Follow the procedure of Example 1 except employ a 0.0003 weight-percent solution of boric acid and rinse for about 15 seconds.

GENERAL CONSIDERATIONS

The particular steps described above in the examples may be varied within limits and still fall within the scope of the novel method. Obviously, the novel method may be used to produce screen structures of different materials on other support surfaces, and for preparing other screen structures than that described in Example 1. By "screen structure" is meant a nonluminescent structure which is a part of the screen or target of a CRT. Some variations in the novel method are described below.

The photopolymeric film may be produced by coating a support surface, as by dipping, spraying, flow coating or spin coating, with a solution of a photopolymeric material. The preferred photopolymeric material is a polyvinyl alcohol which is sensitized with a small amount of ammonium dichromate, sodium dichromate, potassium dichromate, or a soluble salt of a metal such as iron or mercury; or with an organic photosensitizer for a water-based photosensitive material, such as a diazo compound.

Besides polyvinyl alcohol, other water-based photosensitizable polymeric materials may be used. Some suitable water-based materials which can be made photosensitive are proteins such as gelatin, albumen and fish glue; carbohydrates such as gum arabic and starch; and synthetic materials such as polyvinyl pyrollidone. The photopolymeric film may also contain a small amount of a less water-soluble polymer for the purpose of increasing the resistance of the stencil to the erosive action of the chemically-digestive agent. The photopolymeric material is of the type which is insolubilized when it is exposed to a light image. Such photopolymeric films are referred to as negative acting.

Any pattern form may be used as a photographic master for exposing the photosensitive film. Thus, conventional silver halide images may be used either by projection or contact printing. In preparing screen structures for color television picture tubes of the aperture-mask type, it is preferred to use the aperture mask of the tube as a photographic master for exposing the photopolymeric film. In that case, the mask is closely spaced from the film and the light source is placed at three separate locations in order to produce three separate exposures on the film, each at a different location on the film. The aperture mask may have apertures that are round or slit shaped or any other shape or size since the shape and size of the apertures are not critical. Also, the exposure may be used to produce dot or slit or line openings in the matrix.

The photosensitive material is exposed to a pattern of energy rays in the range and of the type to which the photosensitive material is sensitive. Where dichromated polyvinyl alcohol is the photosensitive material, radiant energy in the form of electron beams or as light in the blue and ultraviolet range of the spectrum may be used. Where a contact master is used, one may use a flood exposure. Where the exposure is done by the projection of an image, a small diameter source is preferred. A small circular light source is preferred for making dot screens, and a line light source is preferred for making slit and line screens.

Where a photoresist technique has been used for producing the stencil, the exposed photosensitive film is developed in the manner of the use for that material. In the case of dichromated polyvinyl alcohol, the development is carried out by flushing the surface of the flim with water or with other suitable solvent for the unexposed, still-soluble photosensitive material. With other films, the same or other solvents may be used. The developing solvent is free from borate ions. The development should leave the minimum residue on the bare support surface so as not to interfere with the subsequent overcoating step.

The solution of borate ions may be applied to the stencil in any convenient way as by spraying or with a limp stream while the panel is rotating. The solution is aqueous and may contain one or more boron compounds. Some suitable water-soluble boron compounds are boric acid, borax, sodium perborate, potassium perborate, isobutyl boric acid, trimethyl borate and boric anhydride. The solutions may contain 0.0001 to 5 weight percent of dissolved boron compound. It is preferred to use less than one weight percent because other problems may arise with concentrations between 1 and 5 weight percent of dissolved boron compound. The lower end of the range is preferred because the desired reduction in cosmetic defects may be realized with easier process control than at the higher end of the range.

Washing or rinsing the wet stencil with a solution of a boron compound as described above has the effect of reducing or eliminating the physical appearance of streaks and swirls in the finished matrix when viewed in reflected ambient light. It is believed that the wash or rinse reduces the amount of leaching of polymer from the stencil. This reduces the amount of leached polymer that can be randomly redistributed. The variability in the solubility of the stencil is suppressed. It is believed that a thin encapsulating skin of a complex gel is formed on the surface of the stencil with the borate ions. The encapsulating skin is itself water insoluble and protects the stencil from further action by aqueous media. The gel skin is unique becuase it is compatible with the subsequent overcoating; that is, the gel skin does not affect substantially the wettability of the stencil with respect to the overcoating composition. Furthermore, the encapsulating skin is of molecular dimensions in order not to change the image size. Hence, there is no expansion or contraction of the stencil parts.

The overcoating may be of any particular pigment material which has an average particle size no greater than one micron. Where it is desired to produce a light-absorbing matrix for a cathode-ray tube, it is preferred to include in the overcoating a relatively high loading of a dark pigment. The pigment is preferably elemental carbon in the form of carbon black, acetylene black, or graphite. Other dark pigments that may be used are silver sulfide, iron oxide, lead sulfide, ferrites, and manganese dioxide. The pigment may be black, white or colored.

The overcoating must make a bond to the support surface that will endure the subsequent processing, such as removing the image stencil and depositing the phosphor dots. With some materials, such as some commercially-available dispersions of graphite in water, the graphite upon drying makes a bond to a glass faceplate which is adequate. With other materials, it may be necessary to include a small amount of a binder in the overcoating such that the dry overcoating develops a bond to the support surface through the use of the binder. Colloidal silica is a satisfactory binder for lamp black and acetylene black. For example, about 10% of a colloidal silica with respect to the percent pigment present produces a strong bond to the glass faceplate, especially where a small amount of ammonium dichromate is also present. Besides colloidal silica, alkali silicates may also be used as the binder.

Where a pigment is used for the purpose of making a light-absorbing matrix for a picture tube of the shadow-mask type, the pigment must be deposited in sufficient density to develop the necessary opacity for this purpose. In the case of acetylene black and lamp black, the pigment should be deposited in a weight of about 0.2 to 2.0 mg/cm$^2$ of surface area and, preferably, about 1.0 mg/cm$^2$ or more in order that sufficient thickness remains after tube processing. Where graphite or other pigments are used, slightly lower weights are required for achieving the same opacity in the final graphic image, which is the desired screen structure.

The overcoating should also be permeable to and substantially unaffected by the graphic image developer, which must swell or erode or dissolve at least a part of the image stencil. Where the overcoating is entirely particles, it is necessarily permeable. Where the overcoating contains a binder, the overcoating may be permeable by nature or may be made permeable by crazing the overcoating. The bond between the supporting surface and the overcoating is preferably not substantially attacked by the graphic image developer. When the overcoating-support surface bond is both inert to the attack of the graphic image developer, and is adherent to the surface, it is possible to develop the graphic image after softening with a high-pressure spray of water, without any alteration of the pattern due to localized overdevelopment.

Any substance that dissolves or degrades the polymeric material of the stencil into soluble, partially-soluble, or volatile fragments and leaves the overcoating substantially unattacked may be used for developing the overcoating. The preferred method is to apply to the overcoating an aqueous solution of an oxidizing agent in a concentration sufficiently high such that rapid penetration of the overcoating and softening of the stencil occur. In the case of stencils of hardened polyvinyl alcohol, the stencil softens rapidly with aqueous solutions containing between 1 and 35 weight-percent hydrogen peroxide. Instead of hydrogen peroxide solutions, aqueous solutions of the following may also be used: nitric acid, sodium peroxide, or other alkali peroxides, perchloric acid or alkali perchlorates, hydroflorous acid, alkali hypochlorites, peracetic acid, alkali borates, alkali perborates, sodium hydroxides and certain enzymes.

The time and temperature for developing the overcoating are not critical, especially in view of the fact that they depend only on the removal of the polymeric stencil. However, too fast a development may result in disruption of the overcoating, and too slow a development may result in the weakening of the bond between the overcoating and the support surface. Hence, in each case, the optimum time and temperature for image development are empirically determined.

I claim:

1. A method for producing a screen structure on a surface for a cathode-ray tube including
   (a) exposing a film of water-soluble photopolymeric material on said surface to a light image until the solubilities of the irradiated regions of said film are selectively reduced,
   (b) flushing said exposed film with an aqueous medium that is free from borate ions to remove only the regions of greater solubilities, thereby producing a stencil on said surface,
   (c) rinsing said stencil and support surface with an aqueous solution containing borate ions whereby an encapsulating skin is formed on said stencil for preventing further removal of material from said stencil by subsequently-applied aqueous media,
   (d) then overcoating said stencil and the surface not covered by said stencil with pigment material,
   (e) and then removing only said stencil and the overcoating thereon.

2. The method defined in claim 1 wherein said aqueous solution contains dissolved boric acid.

3. The method defined in claim 1 wherein said aqueous solution contains dissolved boric anhydride.

4. The method defined in claim 1 wherein said aqueous solution contains dissolved borax.

5. The method defined in claim 1 wherein said aqueous solution contains dissolved alkali perborate.

6. A method for producing a screen structure for a cathode-ray tube including
   (a) coating a supporting surface with a film of photosensitized polyvinyl alcohol whose solubility in aqueous media is reduced when it is exposed to light,
   (b) exposing said film to a light image until the solubilities of the irradiated regions of said film are selectively reduced,
   (c) dissolving the more soluble regions of said exposed film with an aqueous medium that is free from borate ions while retaining the less soluble regions of said film in place, said retained film regions constituting a stencil on said surface,
   (d) rinsing said stencil and said supporting surface with an aqueous solution containing borate ions whereby an encapsulating skin is formed on said stencil for preventing further dissolution of said stencil by subsequently-applied aqueous media.
   (e) then overcoating said stencil and the exposed supporting surface with a layer of elemental carbon particles,
   (f) removing the stencil and the overlying portions of the layer while retaining those portions of the layer in direct contact with said supporting surface,
   (g) and then depositing phosphor material on areas of said supporting surface previously occupied by said stencil.

7. The method defined in claim 6 wherein said polyvinyl alcohol is dichromate sensitized.

8. The method defined in claim 7 wherein said carbon particles are graphite particles, which particles are applied from an aqueous slurry.

9. The method defined in claim 8 wherein said aqueous solution consists essentially of boric acid dissolved in water.

10. The method defined in claim 8 wherein said aqueous solution consists essentially of borax dissolved in water.